United States Patent
Emmert

(12) 
(10) Patent No.: US 6,648,232 B1
(45) Date of Patent: Nov. 18, 2003

(54) HIGH TEMPERATURE TAG HAVING ENCLOSED TRANSCEIVER

(75) Inventor: David R. Emmert, Pleasant Lake, IN (US)

(73) Assignee: Moore North America, Inc., Grand Island, NY (US)

(*) Notice: Subject to any disclaimer, the term of this patent is extended or adjusted under 35 U.S.C. 154(b) by 128 days.

(21) Appl. No.: 09/694,573

(22) Filed: Oct. 24, 2000

(51) Int. Cl.[7] .............................................. G06K 19/02
(52) U.S. Cl. ...................................... 235/488; 235/492
(58) Field of Search ................................ 235/488, 480, 235/492

(56) References Cited

U.S. PATENT DOCUMENTS

| | | | |
|---|---|---|---|
| 3,245,697 A | 4/1966 | Nugent | |
| 3,838,252 A | 9/1974 | Hynes | 235/61.12 M |
| 3,949,501 A | 4/1976 | Andrews | 40/2.2 |
| 4,417,413 A | 11/1983 | Hoppe et al. | 156/293 |
| 4,563,575 A | 1/1986 | Hoppe | 235/492 |
| 4,855,583 A * | 8/1989 | Fraser et al. | 235/492 |
| 5,026,452 A | 6/1991 | Kodai | 40/630 |
| 5,196,682 A * | 3/1993 | Englehardt | 235/454 |
| 5,208,450 A * | 5/1993 | Uenishi et al. | 235/488 |
| 5,286,317 A * | 2/1994 | Treat et al. | 156/64 |
| 5,656,369 A | 8/1997 | Chess | 428/331 |
| 5,671,525 A | 9/1997 | Fidalgo | 29/600 |
| 5,707,475 A | 1/1998 | Steidinger et al. | 156/257 |
| 5,779,839 A | 7/1998 | Tuttle et al. | 756/213 |
| 5,817,207 A | 10/1998 | Leighton | 156/298 |
| 5,852,289 A * | 12/1998 | Masahiko | 235/380 |
| 5,982,284 A | 11/1999 | Baldwin et al. | 340/572.8 |
| 6,012,641 A | 1/2000 | Watada | 235/488 |
| 6,027,027 A | 2/2000 | Smithgall | 235/488 |
| 6,036,099 A | 3/2000 | Leighton | 235/488 |
| 6,045,652 A | 4/2000 | Tuttle | 156/292 |
| 6,320,751 B2 * | 11/2001 | Takeda et al. | 174/259 |
| 6,395,373 B2 * | 5/2002 | Conti et al. | 206/460 |

FOREIGN PATENT DOCUMENTS

| | | |
|---|---|---|
| EP | 0 638 873 | 2/1995 |
| JP | 03-112690 | 8/1991 |
| JP | 09-099677 | 8/1997 |

* cited by examiner

Primary Examiner—Diane I. Lee
Assistant Examiner—Kimberly Nguyen
(74) Attorney, Agent, or Firm—Nixon & Vanderhye PC

(57) ABSTRACT

A high temperature RFID tag is provided that is adapted to receive thermal transfer print to provide indicia on an outer surface thereof and adapted to be disposed on a part that is subject to high temperature exposure. The RFID tag is formed as a lamination of a high temperature material such as high temperature polyester and including a window for an RFID generator component, a layer of high temperature resistant material that overlies the opening, and an adhesive material disposed in the window to secure the RFID generator component therein. The layer of high temperature resistant material is preferably transparent so that the indicia can be seen therethrough.

11 Claims, 3 Drawing Sheets

HIGH TEMPERATURE TAG HAVING ENCLOSED TRANSCEIVER

BACKGROUND AND SUMMARY OF THE INVENTION

The present invention relates to a tag having an enclosed transceiver, such as a radio frequency identification "RFID" tag. More specifically, the present invention relates to the field of anti-theft and information tags that are secured to a product and include a relative thin electronic device to assist in preventing theft and/or to contain product information that can be encoded into a signal for identifying the product when the signal is received by a suitable receiver. The thin electronic device may be laminated between outer layers of the tag and an outer surface of the tag may be printed with graphics and/or product information. As presently proposed, the invention is embodied in a high temperature tag with a RFID feature and provides a process for manufacturing such a tag. One application of an article provided by the present invention is a tag that is thermal transfer printed and is placed on a part requiring high temperature exposure.

Electronic (RFID) devices are commercially available and do not per se embody the invention. Early RFID systems were developed utilizing relatively large packages which limited the products on which they could be used. More recently, RFID devices have been made smaller so that they may be readily incorporated in tags or labels and their use can be more widespread. Such electronic devices are characterized in that they are thin, flat and generally flexible devices that are desirably laminated between outer sheets or layers of the tag so as to be relatively undetectable to the casual observer. Due to the more wide spread use of RFID tags, there has been an increasing interest in developing RFID tags that can endure moisture and/or heat exposure as may be encountered by the products to which they are applied.

Thus, it is an object of the present invention to provide a high temperature tag adapted to receive thermal transfer print to provide indicia on an outer surface thereof and adapted to be disposed on a part that is subject to high temperature exposure. The foregoing object is realized in accordance with the invention by forming an RFID tag as a lamination of high temperature material such as high temperature polyester and including a window for an RFID generator component.

BRIEF DESCRIPTION OF THE DRAWINGS

These, as well as other objects and advantages of this invention, will be more completely understood and appreciated by careful study of the following more detailed description of the presently preferred exemplary embodiments of the invention taken in conjunction with the accompanying drawings, in which.

DETAILED DESCRIPTION OF THE INVENTION

Figure 1:
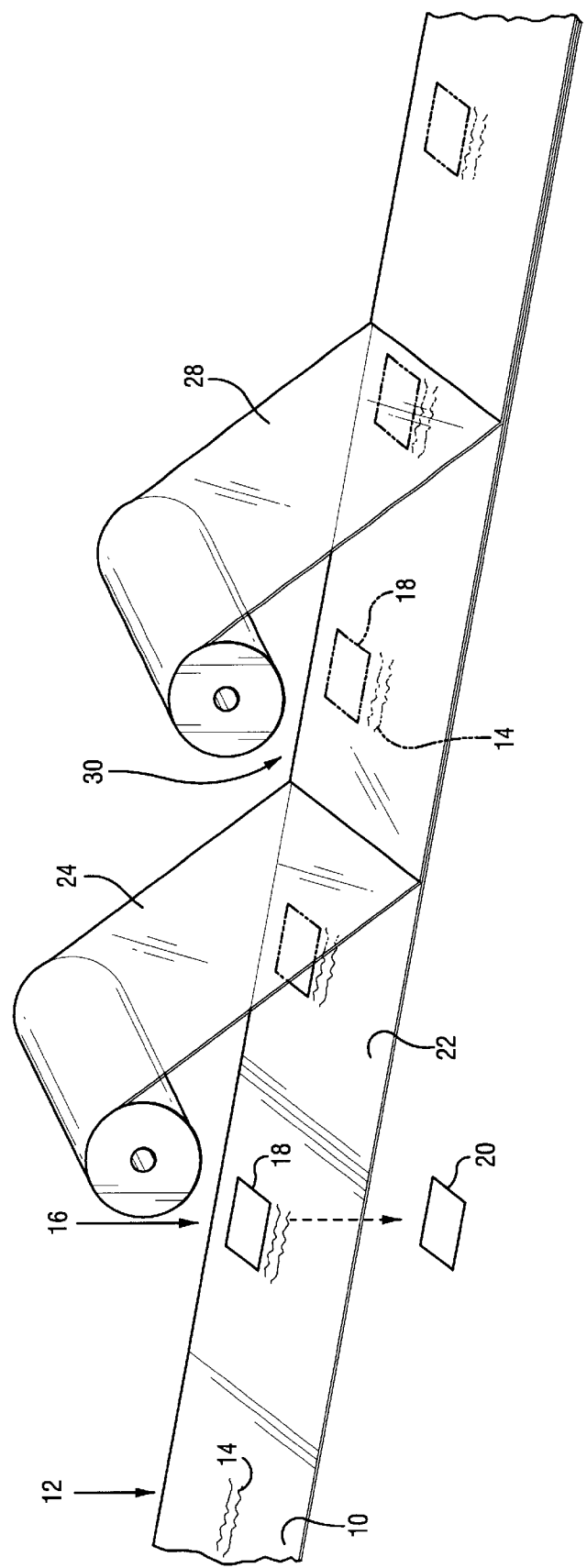
FIG. 1 is a perspective view showing a lamination process for forming an RFID tag adapted to receive an RFID generator component according to an embodiment of the invention.

With reference to FIG. 1, a base material 10 comprising for example, a 4 to 6 mm high temperature polyester sheet, is provided as a substrate in accordance with the present invention. Suitable high temperature materials are available from 3M, Fasson, Flexcon, Medico, Imtech and/or Polyonics. The first line in high temperature materials that may be used for the base material, as noted above, is polyester, which has an upper limit temperature of about 300 degrees F. The next set of high temperature materials can range from about 300 degrees F. to 700 degrees F., i.e, heat resistant so as to maintain structural form and integrity to a temperature in the range from about 300 degrees F. to 700 degrees F. 3M, Imtech, Polyonics, and Madico have materials to accommodate these temperatures. Ultimately the choice of materials, and the adhesive, as discussed in greater detail below will depend at least in part upon the customer's end use specifications. In the exemplary embodiment described hereinbelow, reference will be made to a base material that is a high temperature polyester sheet. It is to be noted, however, that the invention is not limited in its broadest respects to a base material formed from polyester.

The high temperature polyester or other high temperature material sheet is preferably initially printed if necessary or desirable. Thus, in an illustrative embodiment, the high temperature polyester material 10 is, e.g., thermal transfer printed at 12 as needed using intelligent imaging or other known techniques so as to have alphanumeric and/or ornamental indicia 14 thereon. Thereafter, the base material 10 is fed to a die cut press 16. While any known die cutting unit can be used in accordance with the invention. However, the preferred is a cylinder die or die cutting tool that has best controlled die cutting aspects. The best way to die cut this product is on a Flexo press, rotary printing press, rotogravure press, or other in line rotary press. In the illustrated embodiment, the press 16 performs a metal-to-metal dye cut operation to cut a window 18 for receiving an RFID generator component, as discussed in greater detail below. The waste slug 20 from the metal-to-metal die cut process is received and disposed of or recycled as necessary or desirable. In the alternative to the sequence shown, the base material 10 may be fed to a die cut press in advance of being printed.

After the polyester base material 10 has been printed and die cut, the die cut base material 22 is then laminated with another high temperature material 24. This over lamination 24 may be of any of a variety of sizes and adhesion. In the illustrated embodiment, for purposes described in greater detail below, the high temperature lamination 24 overlies at least that portion of the die cut base material 22 in which the window 18 for the RFID generator component has been formed. Because the die cut operation has already been performed to cut the window 18, the adhesive 26 of the over lamination 24 is exposed within the window 18 for purposes to be described in greater detail below. To the extent the temperature resistant layer 24 overlies the indicia printed during the printing step, the layer is preferably sufficiently translucent, at least in part, and more preferably transparent so that the information and indicia thereunder can be visualized therethrough. In a preferred embodiment, a preferred material for component 24 is, for example, a high temperature clear polyester of between about 1 and 3 mm in thickness and having the layer of adhesive 26 pre-applied thereto. Although polyester is preferred in this exemplary embodiment, other suitable materials are available and may be used as noted above with reference to the base material 10. If an adhesive is required with the polyester or other high temperature material, the-adhesive should be able to withstand 120 degrees F. to 300 degrees F. Usually the adhesive is a silicone base, but can be made from other known formulations.

A silicon liner 28 is then preferably applied to prevent the thus exposed adhesive 26 from sticking to the laminated assembly 30 when the laminated assembly 30 is rolled or folded. If desired, before the liner 28 is applied, the laminated, die cut assembly 30 can be punched or the like to form margin holes (not shown in FIG. 1) to prepare the sheet for a later applicator process. Once the lamination and punching (if any) has been completed, as noted above the silicon liner 28 is preferably applied to preclude undesired adhesion of the exposed adhesive 26 as the laminated material 30 is rolled up or fan folded, as appropriate, until further processing can be carried out.

Figure 2:
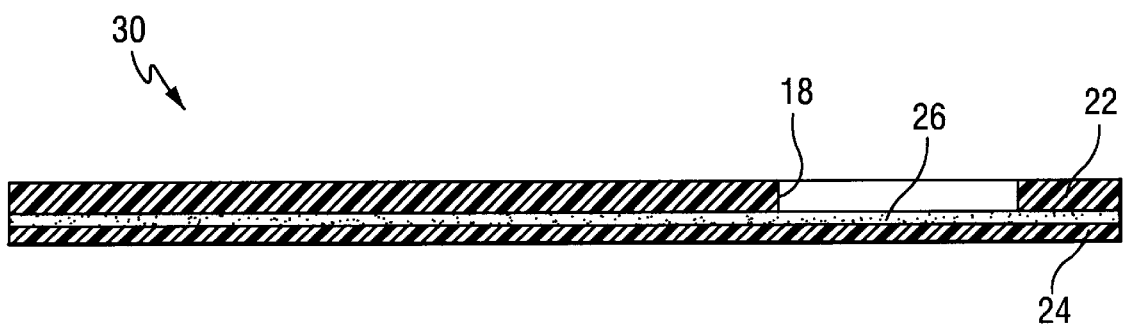
FIG. 2 is a schematic cross-sectional view of a laminate formed by the process illustrated in FIG. 1.

As illustrated in FIG. 2, the thus formed lamination 30, before the liner material 28 is applied includes the die cut base material 22, e.g., high temperature polyester material that is thermal transfer printed, if appropriate, having a die cut window 18 for the placement of the RFID generator component. On one side of the base material the high temperature clear polyester 24 is secured with a layer of adhesive 26. As mentioned above, the adhesive 26 is exposed at the base of the die cut window 18.

Figure 3:
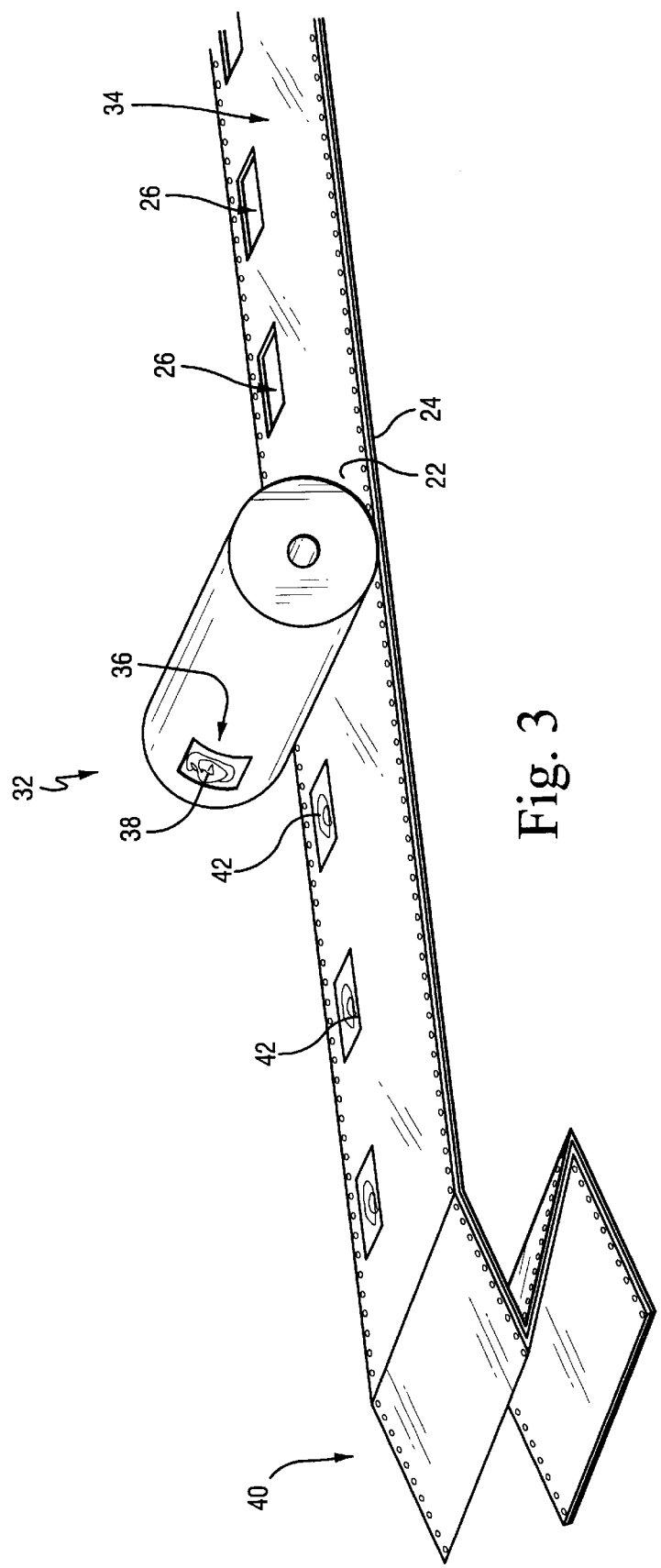
FIG. 3 is a schematic perspective view of an RFID generator component applying process according to a further step of the present invention.

With reference to FIG. 3, to produce a finished article, the rolled material is brought to a Tamarack or other known applicator, shown in part at 32. A Tamarack is a labeling machine available from Tamarack Products Inc. of Waconda, Ill. If not previously formed in the laminated material, margin hole punches, as shown at 34, may be formed in the laminated material 30 so that the material may be controllably advanced through the applicator 32. The silicon liner 24 (not shown in FIG. 3) is taken up as the material 30 is unrolled during an unwinding operation on the applicator. The laminated base material 30 is introduced into the applicator with the adhesive 26 exposed on the bottom of the window 18. In this position, the lamination 24 side is down and the open window 18 is up. The applicator applies the RFID generator component into the open window 18 in the assembly 30. For example, the applicator may cut the RFID generator component 36 and place it into the component window using the exposed adhesive 26 to anchor the RFID component. The RFID face 38 will be in the down position when applied into the window of the basic construction 30. It should be kept in mind in this regard that the RFID device should be selected so as to be able to withstand the same temperatures as the materials of the tag. The RFID device can be sealed in the window with another high temperature material, such as a further layer of polyester, or it can be left open depending on what the customer has designated. Irrespective of whether the window is to be closed, after the applicator process, the material can be finished by fan folding or put into a roll as generally shown at 40 and the product is then ready for use.

As is apparent from a consideration of FIG. 1, any printed media applied to the base material 10 is disposed on the lamination 24 side as shown at 14, as is the face 38 of the RFID component 36. The opposite side of the component 36, indicated at 42, may be disposed in opposed facing relation to a surface of the product to which the tag is applied. In the alternative, the RFID can remain static and be placed as a loose tag if desired. The RFID construction can be punched to be used as a hangtag or tie tag. In the alternative, the construction can have a high temperature transfer tape applied to the back (or face) to make it a PS or self-sticking tag, or it can be placed on a form by gluing. When applied to a product, the RFID component is shielded from high temperature exposure on one side by the product to which the component has been applied (and also a high temperature resistant material if such a layer is applied to close the window), on its periphery by the high temperature base material 10/22 and on its outer surface by the high temperature lamination 24, for example, the high temperature polyester provided in the illustrated embodiment.

As is apparent from the foregoing, the materials and particulars of the assembly are ultimately selected so that the RFID and construction chosen by the customer are compatible with each other. This will insure that the right RFID device (and construction) is selected for the temperature, size, and application, and that the RFID device is compatible with the construction.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A process for forming a high temperature tag having at least one electronic component, comprising the steps of:

providing a heat resistant base material having an upper limit temperature so as to maintain form and integrity to a temperature in the range from about 300° F. to 700° F.;

cutting a window in said base material;

securing a heat resistant layer to a first surface of said base material so that said layer overlies at least a portion of said window, said heat resistant layer having an upper limit temperature so as to maintain form and integrity to a temperature in the range from about 300° F. to 700° F.;

disposing an adhesive material on at least a portion of said layer exposed in said window of said base material; and applying said electronic component to an open end of said window so that said electronic device is adhered by said adhesive in said window.

2. A process for forming a high temperature tag as in claim 1, wherein said heat resistant layer has an adhesive applied to at least select portions of a first surface thereof thereby to secure said heat resistant layer to said base material and to dispose said adhesive material in said window.

3. A process for forming a high temperature tag as in claim 1, wherein said base material is a high temperature polyester.

4. A process for forming a high temperature tag as in claim 1, wherein said heat resistant layer is translucent, at least in part.

5. A process for forming a high temperature tag as in claim 4, wherein said heat resistant layer is transparent, at least in part.

6. A process for forming a high temperature tag as in claim 1, wherein said heat resistant layer is a clear, high temperature polyester.

7. A process for forming a high temperature tag as in claim 1, wherein said heat resistant layer has a width generally corresponding to a width of said base material.

8. A process for forming a high temperature tag as in claim 7, wherein said heat resistant layer has an adhesive applied to substantially the entire first surface thereof thereby to secure said heat resistant layer to said base material and to dispose said adhesive material in said window.

9. A process for forming a high temperature tag as in claim 1, further comprising printing indicia on at least one surface of said base material.

10. A process for forming a high temperature tag as in claim 9, wherein said printing step precedes said securing step.

11. A process for forming a high temperature tag as in claim 9, wherein said printing step precedes said applying step.

* * * * *